United States Patent
Hua et al.

(10) Patent No.: US 7,449,780 B2
(45) Date of Patent: Nov. 11, 2008

(54) APPARATUS TO MINIMIZE THERMAL IMPEDANCE USING COPPER ON DIE BACKSIDE

(75) Inventors: Fay Hua, Fremont, CA (US); Gregory M. Chrysler, Chandler, AZ (US); James G. Maveety, San Jose, CA (US); Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/404,222

(22) Filed: Mar. 31, 2003

(65) Prior Publication Data

US 2004/0188817 A1    Sep. 30, 2004

(51) Int. Cl.
  *H01L 23/48*    (2006.01)
  *H01L 23/52*    (2006.01)
  *H01L 29/40*    (2006.01)
(52) U.S. Cl. ...................... 257/762; 257/707
(58) Field of Classification Search ................. 257/706, 257/707, 711, 713, 720, 758, 762, 767, 751
  See application file for complete search history.

(56) References Cited

U.S. PATENT DOCUMENTS

| | | | | |
|---|---|---|---|---|
| 4,864,384 A | * | 9/1989 | Boudot et al. | 257/728 |
| 5,762,259 A | * | 6/1998 | Hubacher et al. | 228/180.22 |
| 5,773,362 A | * | 6/1998 | Tonti et al. | 438/665 |
| 5,844,310 A | * | 12/1998 | Okikawa et al. | 257/712 |
| 5,895,966 A | * | 4/1999 | Penchuk | 257/690 |
| 6,292,367 B1 | * | 9/2001 | Sikka et al. | 361/705 |
| 6,326,555 B1 | * | 12/2001 | McCormack et al. | 174/255 |
| 6,396,137 B1 | * | 5/2002 | Klughart | 257/691 |
| 6,667,548 B2 | * | 12/2003 | O'Connor et al. | 257/712 |
| 7,208,822 B1 | * | 4/2007 | Reignoux et al. | 257/679 |

* cited by examiner

*Primary Examiner*—S. V Clark
(74) *Attorney, Agent, or Firm*—Schwegman, Lundberg & Woessner, P.A.

(57) ABSTRACT

A method and apparatus to minimize thermal impedance using copper on the die or chip backside. Some embodiments use deposited copper having a thickness chosen to complement a given chip thickness, in order to reduce or minimize wafer warpage. In some embodiments, the wafer, having a plurality of chips (e.g., silicon), is thinned (e.g., by chemical-mechanical polishing) before deposition of the copper layer, to reduce the thermal resistance of the chip. Some embodiments further deposit copper in a pattern of bumps, raised areas, or pads, e.g., in a checkerboard pattern, to thicken and add copper while reducing or minimizing wafer warpage and chip stress.

17 Claims, 4 Drawing Sheets

APPARATUS TO MINIMIZE THERMAL IMPEDANCE USING COPPER ON DIE BACKSIDE

FIELD OF THE INVENTION

This invention relates to the field of electronic package fabrication, and more specifically to a method and apparatus to minimize thermal impedance of an integrated circuit chip using copper on the backside of the die.

BACKGROUND OF THE INVENTION

Bare electronic chips typically need to be packaged in a package that provides thermal cooling and an electric circuit between each electrical connection of the chip and an external connector such as a pin or a ball.

The back side of a chip provides a convenient surface for removing heat generated by the circuits on the chip. Typically, a heat sink is pressed against the chip back side, sometimes using a heatsink compound to reduce thermal resistance. The circuit side of the chip typically provides pads that are connected to the chip's packaging using, for example, solder-ball connections.

Typical packaging includes a ball-grid array package having relatively large balls (e.g., in a ball-grid array) with relatively large spacings on one side of the package for external connections, and small closely spaced pads on the same side or the opposite side for connections to a ball-grid-array set of connections to the electronic chip (such as a processor or memory chip).

Such a package typically has a non-conductive substrate (such as a plastic film or layer) with conductive traces (wires) on or in a surface of the substrate. Some packages include multiple chips, such as one or more logic or processor chips, and/or one or more memory chips, such as a FLASH-type reprogrammable non-volatile memory. Optionally, a cover or encapsulant is used to enclose the chip or chips. Such packaging typically has poor thermal conductivity. Further, the various different coefficients of thermal expansion (CTEs) cause stress on the connections between ports of the packaging.

Chips that run at extremely high frequencies, e.g., upwards of 40 gigahertz, also have constraints as to the type, thickness, spacing, and layout of traces required to provide adequate signal capability. Further, such chips typically need to be run at very low voltages (e.g., about one volt) and very high currents (e.g., one hundred amps), which must be provided in order to achieve the desired high frequencies.

What is needed is a simple, inexpensive, reliable method and apparatus to fabricate packaging for electronic chips, so that the package provides high heat conductivity and dissipation, and high frequency response.

DESCRIPTION OF PREFERRED EMBODIMENTS

Figure 1:
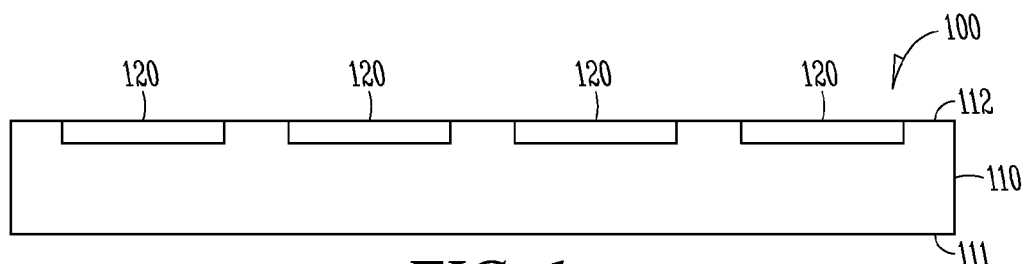
FIG. 1 is a cross-section view of a wafer 100.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

TERMINOLOGY

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements, at least one of which is a metallic element.

The term substrate or core generally refers to the physical that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials. In some embodiments, substrates include layered structures, such as a core sheet or piece of material (such as iron-nickel alloy) chosen for its a coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic layer has wiring traces that carry signals and electrical power horizontally, and vias that carry signals and electrical power vertically between layers of traces.

The term vertical is defined to mean substantially perpendicular to the major surface of a substrate. Height or depth refers to a distance in a direction perpendicular to the major surface of a substrate.

FIG. 1 is a cross-section view of a wafer 100. Wafer 100 has a plurality of integrated circuits 120 formed on a front surface 112 of substrate 100. In some embodiments, the wafer will be diced to provide chips or dice, wherein each die has one circuit 120. In some embodiments, an insulating layer (such as a silicon oxide) is formed between the circuit 120 and the substrate 110.

In some embodiments, the wafer 100, which in some embodiments, starts as an, e.g., 750-micron-thick wafer (0.75 mm), is thinned by removing material from back side 111, e.g., by chemical-mechanical polishing (CMP) to form a thinned wafer 200.

Figure 2:
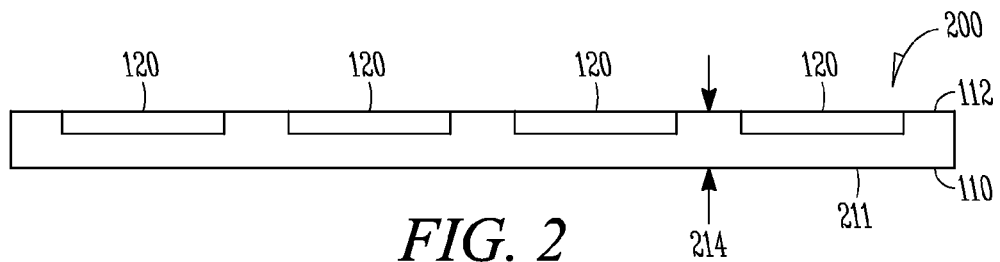
FIG. 2 is a cross-section view of a thinned wafer 200.

FIG. 2 is a cross-section view of a thinned wafer 200. In some embodiments, the thickness 214 (from front 112 to back 211) of the thinned wafer 200 is about one hundred twenty-five microns. In other embodiments, thickness 214 is about two hundred fifty microns. In still other embodiments, wafers thinned to other suitable thicknesses are used. Thinning the wafer reduces the thermal resistance from the heat-generating circuit 120 to the back of the chip, and whatever back-side heat sink is provided. In some embodiments, the amount of thinning also interacts with the amount or thickness of copper that is plated (or otherwise deposited) on the back of the chip in order to achieve the desired warpage minimization. That is, the amount of copper (about 200 microns thick) needed to achieve minimum warpage on a 125-micron-thick thinned silicon chip is different than the amount of copper (about 430 microns thick) needed to achieve minimum warpage on a 250-micron-thick thinned silicon chip.

Copper has better conductivity than silicon. However, without a barrier layer, copper can migrate into and through silicon substrate 110 and into circuit 120, ruining the circuit. This can particularly be a problem when the substrate has been thinned. In some embodiments, migration is prevented by a barrier layer deposited between the substrate and copper that prevents copper migration into the silicon. In some embodiments, tantalum nitride is used, which has low resistivity to aid in plating and excellent adhesion to hold the copper, but which is deposited to a thickness that is sufficiently thick to avoid pinholes and to substantially prevent copper migration into the silicon wafer. In some embodiments, before copper plating, tantalum nitride is deposited by physical vapor deposition (PVD) or sputtering in very thin films, and then annealed, e.g., at a temperature of about 750° C. In some embodiments, the back side 211 of thinned wafer 200 is coated with an effective thickness (to block copper and prevent pinholes) of another suitable material (i.e., other than tantalum nitride) to form barrier layer 331, and a copper layer 330 is deposited, for example, by plating.

Figure 3:
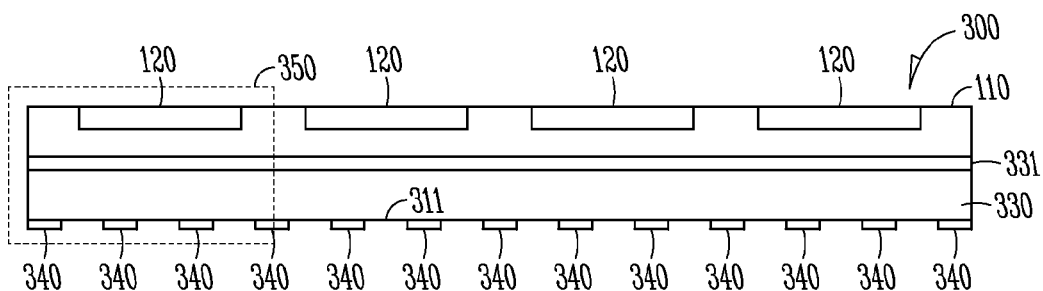
FIG. 3 is a cross-section view of a plated thinned wafer 300.

FIG. 3 is a cross-section view of a plated thinned wafer 300, having barrier layer 331 and copper layer 330, according to some embodiments of the invention. In some embodiments, the thickness of copper layer 330 is selected to reduce or minimize chip and/or wafer warping. In some embodiments, the wafer is thinned to about one hundred twenty-five microns, and a thickness of about two hundred microns is used for copper layer 330. See FIG. 6. In other embodiments, the wafer is thinned to about two hundred fifty microns, and a thickness of about four hundred thirty-five microns is used for copper layer 330. See FIG. 7. In yet other embodiments, other thicknesses of silicon are used, corresponding graphs of warpage versus copper thickness are measured or simulated, and an appropriate thickness of copper is used.

Figure 4A:
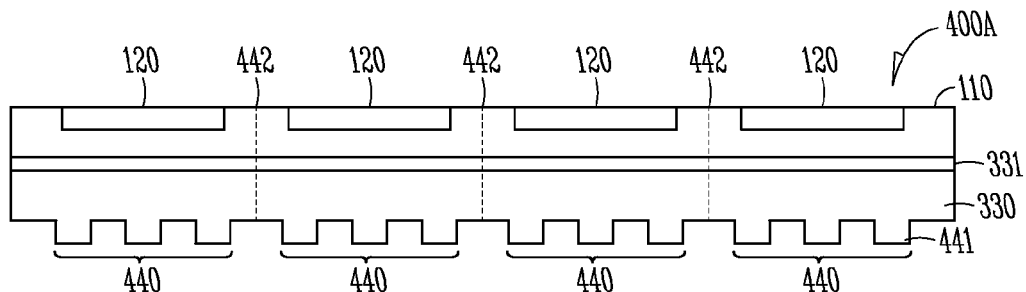
FIG. 4A is a cross-section view of a further-plated thinned wafer 400.
Figures 9A, 9B:
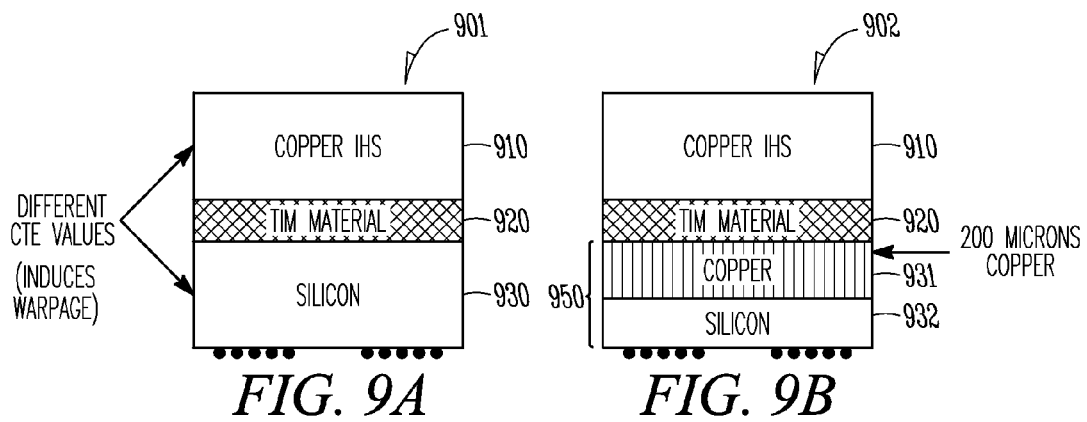
FIG. 9A shows a side view schematic of a conventional stackup 901.
FIG. 9B shows a side view schematic of a stackup 902 according to some embodiments of the invention.

In some embodiments, the flat copper layer 330 is used as is shown in FIG. 3 (without the resist-defined pattern of copper in additional raised areas as described in FIG. 4A) for the diced chip 350 to be packaged as shown in FIG. 9B. In other embodiments, further plating of copper in a pattern is used, wherein a patterned layer of photoresist 340 (or other suitable material) is formed on the bottom surface 311 of copper layer 330, and further copper is plated where no resist is blocking the plating.

FIG. 4A is a cross-section view of a further-plated thinned wafer 400A having patterns 440 each having a plurality of bumps or pads 441, according to some embodiments of the invention. In some embodiments, bump patterns 440 are formed as areas of additional thickness copper (in addition to flat layer 330) in a checkerboard pattern on the back of what will be each chip.

Figure 4B:
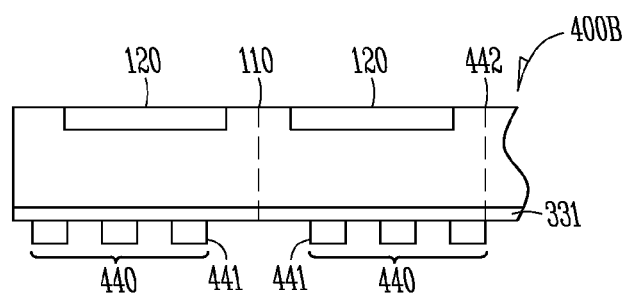
FIG. 4B is a cross-section view of a checkerboard-plated thinned wafer 400, with zero base copper thickness.

In other embodiments as shown in FIG. 4B, the checkerboard pattern 440 is made directly on the barrier layer 331 of wafer 400B (i.e., as if layer 330 in FIG. 4A had zero thickness). By using a checkerboard pattern with a zero-thickness layer 330, one removes the precision required on the thickness of the copper layer, since the checkerboard pattern reduces the lateral size of contiguous copper areas, such that the copper (at any thickness) can expand or contract without warping the wafer or the chip substrate.

Figure 5:
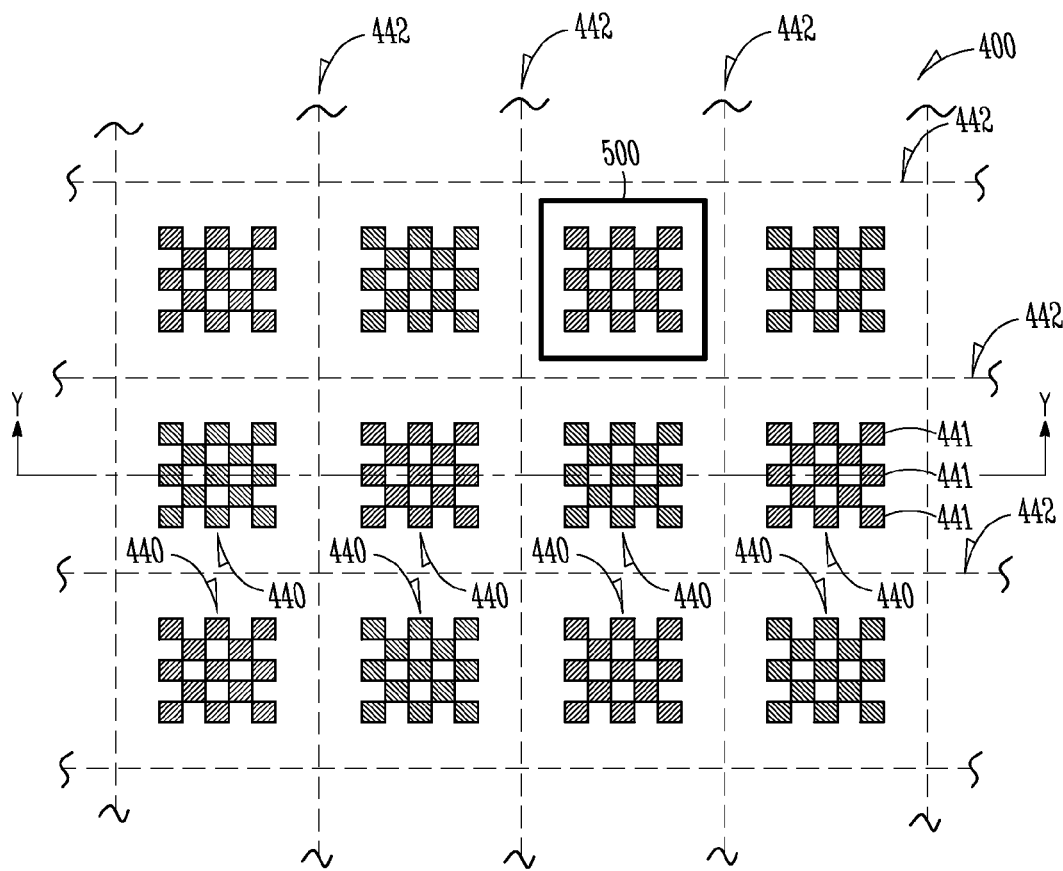
FIG. 5 is a plan schematic view of further-plated thinned wafer 400.

In some embodiments, the rows and columns of the checkerboard pattern are all of substantially equal widths (i.e., squares of additional thickness alternating with squares of the basic thickness of copper as shown in FIG. 5), while in other embodiments, uneven patterns are used (see, e.g., FIG. 10), such as every other row and column being much wider than the intervening ones. In some embodiments, a crosshatch pattern of open "streets" or paths 442 is left (without additional plating) between individual islands or patterns of islands 440, wherein the streets correspond to the boundary of the chips.

FIG. 5 is a plan schematic view of further-plated thinned wafer 400. In some embodiments, each further-plated pattern 440 is a checkerboard of raised pads or areas 441. The checkerboard pattern prevents any large contiguous areas of copper that would expand and contract differentially from the substrate 110 and copper layer 330 (see FIG. 3). In some embodiments, as shown in FIG. 5, each checkerboard pattern has rows and columns that are all of substantially equal widths.

In some embodiments, the wafer is then diced into a plurality of individual plated chips 500, each having a plurality of raised areas 441. In some embodiments, a clear street or channel (having little or no copper thickness) is provided between each chip, in order to prevent warping at a wafer level. In other embodiments, the individual plated chips 500 are flat-backed chips 350 that have a flat (bumpless) copper layer 330 such as shown in FIG. 3 (but without the patterned resist 340) made to a thickness that results in zero or very low warpage, as described for FIGS. 6-8.

Figure 6:
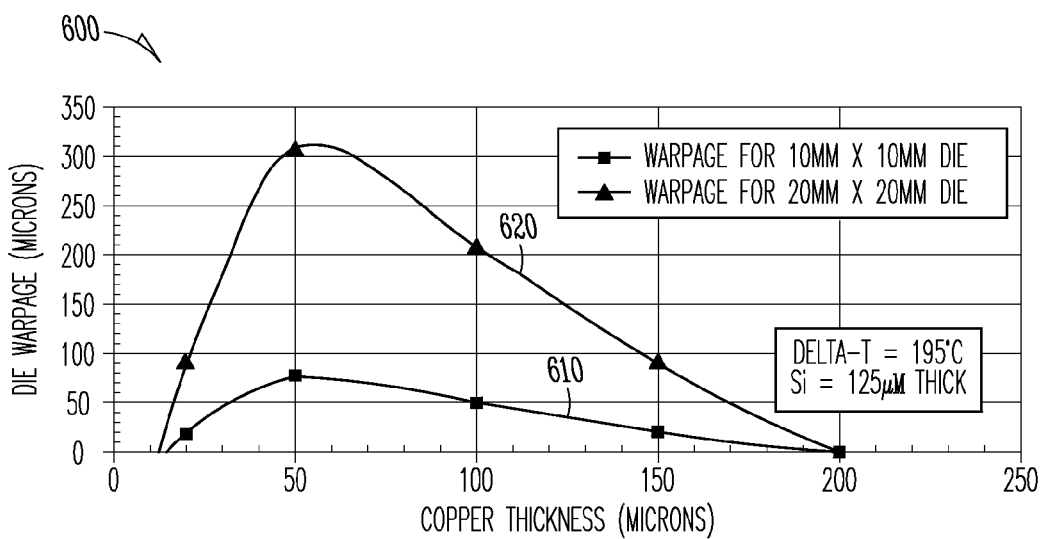
FIG. 6 is a graph 600 of warpage vs. copper thickness for 125-micron-thick chips.

FIG. 6 is a graph 600 of warpage versus copper thickness for 125-micron-thick dice, with a change in temperature of 195 degrees C. Plot 610, indicated by squares, represents the warpage of a 10-mm-by-10-mm die, while plot 620, indicated by triangles, represents the warpage of a 20-mm-by-20-mm die. A first zero-crossing (minimum of the absolute value of warpage) is extrapolated to occur at about thirty microns of copper; however, more copper is generally desired to better spread the heat from the chip. A maximum in chip warpage is seen at about 50 microns of copper. Another zero-crossing (minimum of the absolute value of warpage) in chip warpage for both plot 610 and plot 620 is seen at about two-hundred microns of copper thickness. Thus, the total chip thickness including the silicon and the copper backing layer is about 325 microns, or a little less that one-third of a millimeter.

Figure 7:
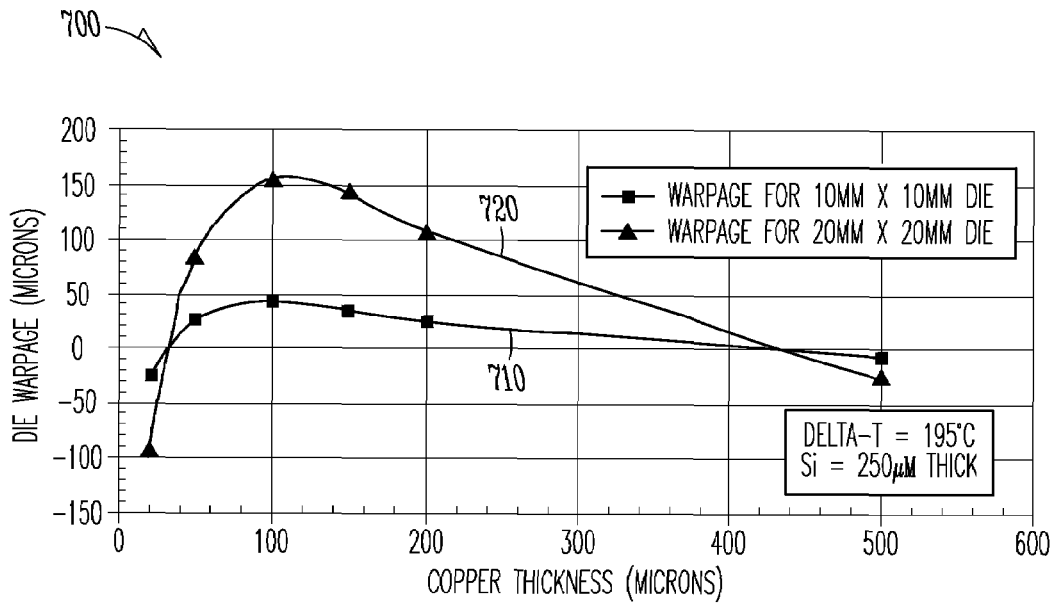
FIG. 7 is a graph 700 of warpage vs. copper thickness for 250-micron-thick chips.

FIG. 7 is a graph 700 of warpage versus copper thickness for 250-micron-thick chips, with a change in temperature of 195 degrees C. Plot 710, indicated by squares, represents the warpage of a 10-mm-by-10-mm die, while plot 720, indicated by triangles, represents the warpage of a 20-mm-by-20-mm die. A first zero crossing (minimum of the absolute value of warpage) is extrapolated to occur at about thirty microns of copper. A maximum in chip warpage is seen at about 100 microns of copper. Another zero crossing (minimum of the absolute value of warpage) in chip warpage for both plot 710 and plot 720 is seen at about four-hundred-thirty microns of copper. Thus, the total chip thickness including the silicon and the copper backing layer is about 680 microns, or a little more that two-thirds of a millimeter.

Figure 8:
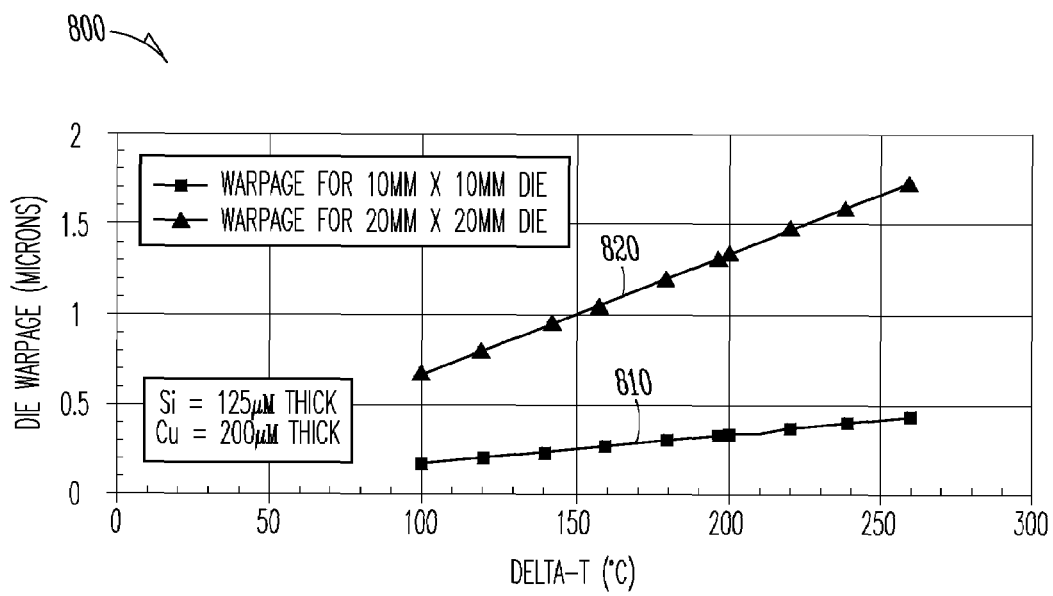
FIG. 8 is a graph 800 of warpage versus temperature for 125-micron-thick chips with 200-micron copper layer.

FIG. 8 is a graph 800 of warpage versus temperature for 125-micron-thick chips with 200-micron copper layer. Plot 810, indicated by squares, represents the warpage of a 10-mm by 10-mm die (less than about ½ microns warpage over a wide temperature range), while plot 820, indicated by triangles, represents the warpage of a 20-mm by 20-mm die (less than about 2 microns warpage over a wide temperature range).

FIG. 9A shows a side view schematic (not to scale) of a conventional stackup 901, in some embodiments having a silicon chip 930, thermal interface material (TIM) 920 (such as heat-sink compound, for example Shin-Etsu 7756 from Shin-Etsu Chemical Co., Ltd., http://www.shinetsu.cojp), and heat sink 910 (e.g., made of copper and optionally including fins and/or a fan in some embodiments). In some embodiments, because of the differing CTEs between the silicon chip and the copper heat sink, a warpage condition is induced wherein the heat sink and/or silicon wafer differentially expand or contract.

FIG. 9B shows a side view schematic (not to scale) of a stackup 902 according to some embodiments of the invention having a plated chip 950 (such as a bumped chip 500 of FIG. 5 or a flat-copper-backed chip 350 of FIG. 3) that includes a thinned silicon chip 932 (e.g., about 125 microns thick, in some embodiments) and a plated copper layer 931 (e.g., about 200 microns thick, in some embodiments). On the back of chip 950 is a thermal interface material 920, and heat sink 910 (e.g., made of copper in some embodiments). In some embodiments, a flat copper layer 931 such as layer 330 shown in FIG. 3 is used. Because the copper backing thickness on the chip and the chip thickness are matched, they do not warp, and the copper backing and the copper heat sink are the same or similar material so there is reduced or eliminated warpage.

Figure 10:
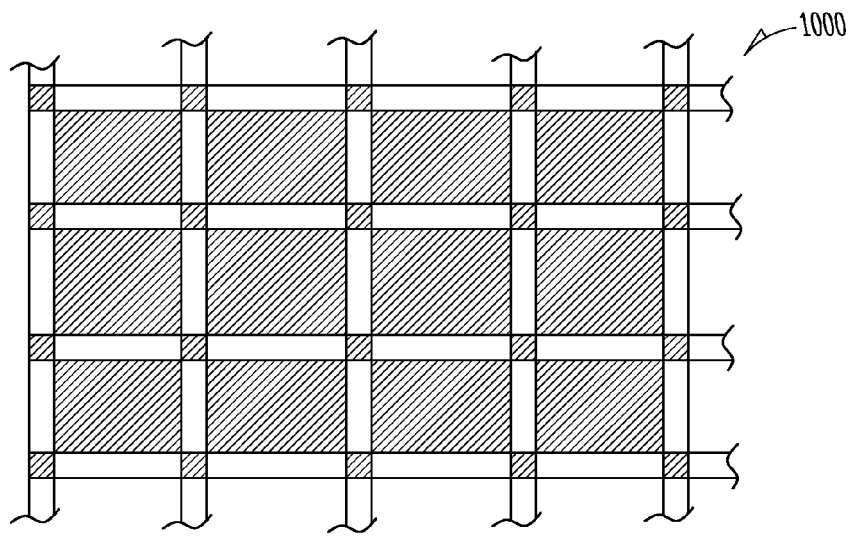
FIG. 10 is a plan-view schematic of a checkerboard pattern having different-sized rectangles.

FIG. 10 is a plan-view schematic of a checkerboard pattern 1000 having different-sized rectangles, used in some embodiments. In some embodiments, the shaded areas represent areas having additional thickness of deposited copper, and the unshaded areas represent areas having a basic thickness of copper (e.g., 200 microns of copper on a 125-micron thick silicon chip, for example). In contrast to the equal-sized square checkerboard pattern of FIG. 5 which provides fifty percent of the area in raised squares (thicker copper) and fifty percent of the area with the basic thickness of copper, the pattern 1000 shown in FIG. 10 provides substantially more than fifty percent in raised squares (thicker copper) separated by narrow rectangles representing the basic thickness of copper.

In some embodiments, the unshaded areas on FIG. 10 represent areas having zero thickness of copper. Thus, the small shaded squares and the large shaded squares are islands that touch only at their corners. In some embodiments, the small shaded squares also represent areas having zero thickness of copper, in effect providing islands that do not touch and are completely separated from one another by narrow lanes. In some embodiments, other geometric patterns are used for the copper islands, such as rectangles, triangles, and/or hexagons, for example. All of these embodiments having islands of copper touching only at vertices, or not touching at all, are still considered to be "checkerboard patterns" for the purposes of this discussion and the appended claims.

In some embodiments, particularly for relatively small chips, a single copper island is centered on the back of each circuit on a wafer, such that when the dices are apart, each chip has a copper island substantially covering much or substantially all of its back. In other embodiments, such as shown in FIG. 5, a plurality of islands is formed on the back of each chip, with each chip's pattern separated from the patterns of adjoining chips by a narrow street or channel with zero or very little copper thickness.

In some embodiments, the thickness of the base layer is empirically determined by, for example, choosing a thickness of the silicon chip to be used (e.g., thinning a wafer having a plurality of chips to, say, 125 microns thick), depositing a barrier layer of, for example, tantalum nitride or other suitable barrier material, plating differing amounts of copper and measuring the resulting amounts of temperature-induced warpage and graphing the warpage results. Then choosing a thickness of copper from the graph that achieves the anti-warpage characteristics desired. In some embodiments, a number of different base thicknesses of copper are chosen, and each is plated with an additional amount of copper in a pattern of raised areas, e.g., in a checkerboard pattern, wherein the warpage of the resulting base-plus-raised-area is measured and graphed for different amounts of additional thickness in the checkerboard pattern. The thicknesses for the base copper thickness and for the additional thickness in the checkerboard pattern are then selected in order that the entire device achieves the desired minimization of warpage. In some embodiments, empirically derived thicknesses also take into consideration warpage effects caused by the attached heat sink (e.g., 910 of FIG. 9A) and interface material (e.g., 920 of FIG. 9A).

Figure 11:
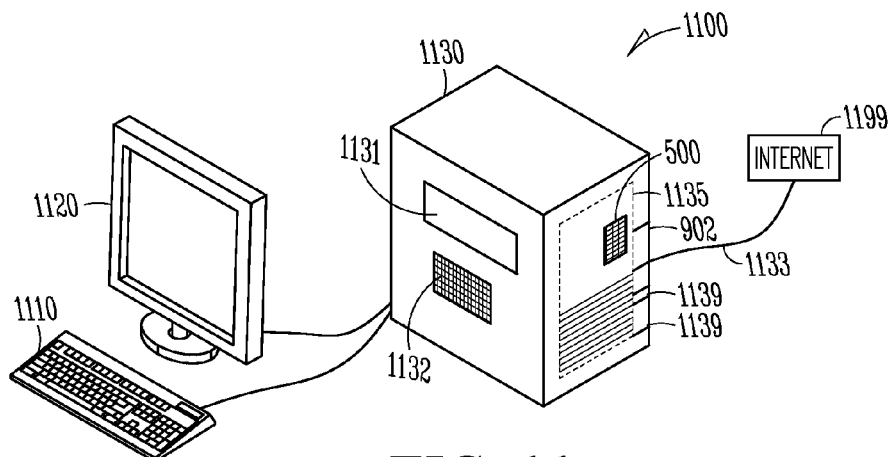
FIG. 11 is a perspective-view schematic of an information-handling system 1100 having a plated chip 500 in a stackup 902 on a motherboard 1135.

FIG. 11 is a perspective-view schematic of an information-handling system 1100 that includes a plated chip 500 in a stackup 902 on a motherboard 1135. In some embodiments, system 1100 includes input/output devices such as keyboard 1110, display 1120, one or more of CDROM/DVD player and/or recorder/CDRW drive 1131, diskette drive 1132 and internet connection 1133 used to connect to the internet 1199. System box 1130 holds a number of parts including a power supply and a motherboard 1135. Motherboard 1135 connects to one or more memories 1139 (such as DIMM or RIMM packages, for example), and includes one or more chips 500 packaged alone or in a stackup such as 902 of FIG. 9B.

Some embodiments of the invention include an apparatus that includes an electronics chip having a substrate with a first face having circuitry thereon and a second face opposite the first face, a barrier layer deposited on the second face, and a copper layer deposited to a first thickness on the barrier layer.

In some embodiments of this apparatus, the first thickness of the copper layer is between one and two times a thickness of the substrate.

In some embodiments of this apparatus, the first thickness of the copper layer is between 1.5 and 1.8 times the thickness of the substrate.

In some embodiments of this apparatus, the first thickness of the copper layer is between 1.55 and 1.75 times the thickness of the substrate.

In some embodiments of this apparatus, the first thickness of the copper layer is about 1.6 times the thickness of the substrate.

In some embodiments of this apparatus, the first thickness of the copper layer is about 1.73 times the thickness of the substrate.

In some embodiments of this apparatus, the first thickness of the copper layer is 1.6 times the thickness of the substrate.

In some embodiments of this apparatus, a portion the copper layer is deposited to a second thickness greater than the first thickness.

In some embodiments of this apparatus, the portion of the copper layer deposited to the second thickness is in a checkerboard pattern.

In some embodiments of this apparatus, the first thickness of copper is about 200 microns thick.

In some embodiments of this apparatus, the substrate of the electronics chip is about 125 microns thick.

Other embodiments of the invention include a method that includes providing a first electronics chip having a semiconductor electronics circuit formed on a first face and being covered on a second face of the chip opposite the first face with a barrier layer, and depositing a copper layer to a first thickness over the barrier layer.

In some embodiments of this method, the depositing the first thickness makes the copper layer between one-tenth and ten times a thickness of the substrate.

In some embodiments of this method, the depositing the first thickness makes the copper layer between one-fifth and five times a thickness of the substrate.

In some embodiments of this method, the depositing the first thickness makes the copper layer between one-half and five times a thickness of the substrate.

In some embodiments of this method, the depositing the first thickness makes the copper layer between two-thirds and three times a thickness of the substrate.

In some embodiments of this method, the depositing the first thickness makes the copper layer between one and two times a thickness of the substrate.

In some embodiments of this method, the depositing the first thickness makes the copper layer between 1.3 and 2.0 times the thickness of the substrate.

In some embodiments of this method, the depositing the first thickness makes the copper layer between 1.4 and 1.9 times the thickness of the substrate.

In some embodiments of this method, the depositing the first thickness makes the copper layer between 1.5 and 1.8 times the thickness of the substrate.

In some embodiments of this method, the depositing the first thickness makes the copper layer between 1.55 and 1.75 times the thickness of the substrate.

In some embodiments of this method, the depositing the first thickness makes the copper layer about 1.5 times the thickness of the substrate.

In some embodiments of this method, the depositing the first thickness makes the copper layer about 1.55 times the thickness of the substrate.

In some embodiments of this method, the depositing the first thickness makes the copper layer about 1.6 times the thickness of the substrate.

In some embodiments of this method, the depositing the first thickness makes the copper layer about 1.65 times the thickness of the substrate.

In some embodiments of this method, the depositing the first thickness makes the copper layer about 1.7 times the thickness of the substrate.

In some embodiments of this method, the depositing the first thickness makes the copper layer about 1.75 times the thickness of the substrate.

In some embodiments of this method, the depositing the first thickness makes the copper layer about 1.8 times the thickness of the substrate.

In some embodiments of this method, the depositing the first thickness makes the copper layer about 1.60 times the thickness of the substrate.

In some embodiments of this method, the depositing the first thickness makes the copper layer about 1.73 times the thickness of the substrate.

In some embodiments of this method, the depositing the first thickness makes the copper layer 1.60 times the thickness of the substrate.

In some embodiments of this method, the depositing the first thickness makes the copper layer 1.73 times the thickness of the substrate.

In some embodiments of this method, the first thickness of copper is about 200 microns thick. In other embodiments, the copper layer thickness is about 400 microns.

Some embodiments of this method further include thinning the substrate of the electronics chip to about 125 microns thick before the depositing of the copper layer. Other embodiments of this method further include thinning the substrate of the electronics chip to about 250 microns thick before the depositing of the copper layer. Still other embodiments of this method further include thinning the substrate of the electronics chip to other suitable thicknesses before the depositing of the copper layer.

Some embodiments of this method further include depositing a portion of the copper layer to a second thickness greater than the first thickness. In some embodiments, the portion of the copper layer deposited to the second thickness is in a checkerboard pattern.

Another aspect of the invention in some embodiments includes an apparatus that includes an electronics chip and copper layer means, as described above, attached to a back side of the chip for conducting heat and minimizing warpage.

In some embodiments, the copper layer means includes a plated copper layer and a barrier layer separating the chip from copper layer. In some embodiments, the copper layer means includes a copper layer thickness of about 200 microns. In other embodiments, the copper layer means includes a copper layer thickness of about 400 microns.

In some embodiments, the copper layer means includes a base copper layer thickness, and a checkerboard pattern of additional copper thickness.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. An apparatus comprising:
an electronics chip having a substrate with a first face having circuitry thereon and a second face opposite the first face;
a copper layer located on at least a portion of the second face, the copper layer having a first thickness effective to reduce or minimize chip warpage for a particular substrate thickness, wherein the first thickness is about 200 microns and the thickness of the substrate is about 125 microns; and
a barrier layer located between the circuitry and the copper layer to prevent copper migration from the copper layer into the circuitry.

2. The apparatus of claim 1 further comprising a second thickness of copper located on at least a portion of the second face, the second thickness of copper greater than the first thickness.

3. The apparatus of claim 1 wherein the first thickness is arranged in a checkerboard pattern of islands leaving other portions of the second face without any copper thickness.

4. An apparatus comprising:
an electronics chip having a substrate with a first face having circuitry thereon and a second face opposite the first face, the substrate having a thickness no greater than about 250 micrometers;
a copper layer located on at least a portion of the second face, the copper layer having a first thickness effective to reduce or minimize chip warpage for a particular substrate thickness;
a second thickness of copper located on at least a portion of the first thickness and the second thickness of copper greater than the first thickness, wherein the first thickness and the second thickness are arranged in a checkerboard pattern having different-sized rectangles, wherein the second thickness comprises more than fifty percent of the checkerboard pattern; and
a barrier layer located between the circuitry and the copper layer to prevent copper migration from the copper layer into the circuitry.

5. The apparatus of claim 4 wherein the first thickness of the copper layer is between one and two times the thickness of the substrate.

6. The apparatus of claim 4, wherein the circuitry includes at least a portion of a processor, the apparatus further comprising:
a memory operatively coupled to the processor;
an input/output system operatively coupled to the processor; and
a power supply operatively coupled to the processor.

7. An apparatus comprising:
an electronics chip having a substrate with a first face having circuitry thereon and a second face opposite the first face, the substrate having a thickness no greater than about 250 micrometers;
a copper layer located on at least a portion of the second face, the copper layer having a first thickness effective to reduce or minimize chip warpage for a particular substrate thickness, wherein the first thickness is arranged in a checkerboard pattern of islands leaving other portions of the second face without any copper thickness; and
a barrier layer located between the circuitry and the copper layer to prevent copper migration from the copper layer into the circuitry.

8. The apparatus of claim 7 wherein the first thickness of the copper layer is between one and two times the thickness of the substrate.

9. The apparatus of claim 7, wherein the circuitry includes at least a portion of a processor, the apparatus further comprising:
a memory operatively coupled to the processor;
an input/output system operatively coupled to the processor; and
a power supply operatively coupled to the processor.

10. An apparatus comprising:
a plated chip having a first face with circuitry thereon and a second face opposite the first face, the plated chip comprising a thinned chip having a thinned chip thickness and a plated layer having a plated layer thickness, wherein the plated layer thickness and the thinned chip thickness have a ratio of about 1.3 to 1; and
a thermal interface material located on an exposed surface of the plated layer.

11. The apparatus of claim 10, further including a heat sink located on an exposed surface of the thermal interface material.

12. The apparatus of claim 11, wherein the heat sink and the plated layer each comprise essentially the same material.

13. The apparatus of claim 12 wherein the heat sink and the plated layer each comprise copper.

14. The apparatus of claim 10 wherein the plated layer thickness is about 200 microns.

15. The apparatus of claim 14, wherein the thinned chip thickness is about 125 microns.

16. The apparatus of claim 10, wherein the plated chip is a bumped chip.

17. The apparatus of claim 10, wherein the plated chip is a flat-copper-backed chip.

* * * * *

UNITED STATES PATENT AND TRADEMARK OFFICE
CERTIFICATE OF CORRECTION

PATENT NO. : 7,449,780 B2  Page 1 of 1
APPLICATION NO. : 10/404222
DATED : November 11, 2008
INVENTOR(S) : Hua et al.

It is certified that error appears in the above-identified patent and that said Letters Patent is hereby corrected as shown below:

In column 9, line 39, in Claim 4, delete "first thickness and" insert -- second face, --, therefor.

Signed and Sealed this

Tenth Day of February, 2009

JOHN DOLL
*Acting Director of the United States Patent and Trademark Office*